(12) United States Patent
Saib et al.

(10) Patent No.: US 10,578,978 B2
(45) Date of Patent: Mar. 3, 2020

(54) METHOD FOR DETERMINING THE DOSE CORRECTIONS TO BE APPLIED TO AN IC MANUFACTURING PROCESS BY A MATCHING PROCEDURE

(71) Applicant: ASELTA NANOGRAPHICS, Grenoble (FR)

(72) Inventors: Mohamed Saib, Saint Martin d'Heres (FR); Patrick Schiavone, Villard-Bonnot (FR); Thiago Figueiro, Grenoble (FR); Sébastien Bayle, Lan-en-Vercors (FR)

(73) Assignee: ASELTA NANOGRAPHICS, Grenoble (FR)

( * ) Notice: Subject to any disclaimer, the term of this patent is extended or adjusted under 35 U.S.C. 154(b) by 0 days.

(21) Appl. No.: 15/763,829

(22) PCT Filed: Oct. 5, 2016

(86) PCT No.: PCT/EP2016/073744
§ 371 (c)(1),
(2) Date: Mar. 27, 2018

(87) PCT Pub. No.: WO2017/060273
PCT Pub. Date: Apr. 13, 2017

(65) Prior Publication Data
US 2018/0203361 A1    Jul. 19, 2018

(30) Foreign Application Priority Data

Oct. 7, 2015 (EP) .................................. 15306580

(51) Int. Cl.
*G06F 17/50* (2006.01)
*G03F 7/20* (2006.01)

(52) U.S. Cl.
CPC .......... *G03F 7/705* (2013.01); *G03F 7/70458* (2013.01); *G03F 7/70516* (2013.01)

(58) Field of Classification Search
CPC .............................. G03F 7/05; G03F 7/70458
(Continued)

(56) References Cited

U.S. PATENT DOCUMENTS

| 6,033,814 A | 3/2000 | Burdorf et al. |
| 6,463,403 B1 | 10/2002 | Burdorf et al. |

(Continued)

FOREIGN PATENT DOCUMENTS

| EP | 1 560 073 A2 | 8/2005 |
| JP | 2013-207045 A | 10/2013 |

(Continued)

*Primary Examiner* — Suchin Parihar
(74) *Attorney, Agent, or Firm* — Baker & Hostetler LLP

(57) ABSTRACT

A method is provided to easily determine the parameters of a second process for manufacturing from the parameters of a first process. Metrics representative of the differences between the two processes are computed from a number of values of the parameters, which can be measured for the two processes on a calibration layout, or which can be determined from pre-existing values for layouts or reference data for the two processes by an interpolation/extrapolation procedure. The number of metrics is selected so that their combination gives a precise representation of the differences between the two processes in all areas of a design. Advantageously, the metrics are calculated as a product of convolution of the target design and a compound of a kernel function and a deformation function. A reference physical model of the reference process is determined. A sizing correction to be applied to the edges of the design produced by the reference process is calculated. It is then converted, totally or partially, into a dose correction.

16 Claims, 10 Drawing Sheets

(58) Field of Classification Search
USPC .......................................................... 716/54
See application file for complete search history.

(56) References Cited

U.S. PATENT DOCUMENTS

| | | | |
|---|---|---|---|
| 2005/0168716 A1* | 8/2005 | Ausschnitt | G03F 7/70516 355/55 |
| 2007/0105029 A1* | 5/2007 | Ausschnitt | B81C 99/0065 430/30 |
| 2009/0300573 A1 | 12/2009 | Cao et al. | |
| 2018/0203361 A1* | 7/2018 | Saib | G03F 7/70458 |
| 2018/0267399 A1* | 9/2018 | Quaglio | G03F 1/20 |

FOREIGN PATENT DOCUMENTS

| | | |
|---|---|---|
| WO | 2015/185576 A1 | 12/2015 |
| WO | 2015/185598 A1 | 12/2015 |

* cited by examiner

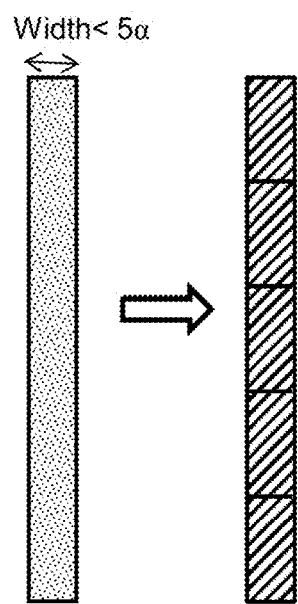 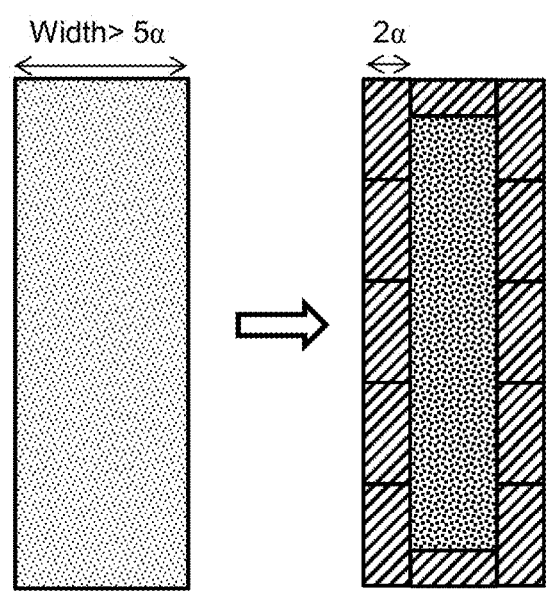
FIG.5a
FIG.5b

METHOD FOR DETERMINING THE DOSE CORRECTIONS TO BE APPLIED TO AN IC MANUFACTURING PROCESS BY A MATCHING PROCEDURE

CROSS-REFERENCE TO RELATED APPLICATIONS

This application is a National Stage of International patent application PCT/EP2016/073744, filed on Oct. 5, 2016, which claims priority to foreign European patent application No. EP 15306580.0, filed on Oct. 7, 2015, the disclosures of which are incorporated by reference in their entirety.

FIELD OF THE INVENTION

The present invention notably applies to the field of electronic or optical lithography. It applies, among other processes, to mask write and direct write. It can also apply to other steps of semiconductor manufacturing processes, such as nanoimprint, DSA (Directed Self Assembly), etching, CMP (Chemical Mechanical Polishing/Planarization), annealing, baking, metrology, etc. . . .

BACKGROUND

During the process of mask write or direct write, several factors contribute to induce errors and prevent the achievement of the expected resolution. Some of these factors are the electron scattering (forward and backward), resist diffusion, resist thickness, etching, flare, fogging, metrology, etc. In order to improve the resolution and reduce the impact of these phenomena, there are several strategies of proximity effect correction (PEC), fogging effect correction (FEC), etching compensation, among others. The strategies are based on a prediction of the impact of each effect of a correction of these by means of dose and/or geometry compensation. Therefore, the quality of the correction depends upon the quality of the models used to predict the phenomena, said models being different from one manufacturing process to another. High precision of the model and the corrections can certainly be obtained, but at a high computation cost.

A problem is that, in any production flow, it is necessary to change the process from time to time. This may come from the purchase of new equipment, new resists, etc. In many cases maintaining identical behavior from the previous flow is desirable. In the prior art, this is achieved by tuning the process conditions. The physical process parameters (etch bias, power, resist thickness, bake, etc. . . . ) are changed which is time consuming and quite costly.

Solutions for alleviating this burden have been found in the context of optical proximity effect correction (OPC). Some of these solutions are disclosed by U.S. Pat. Nos. 6,033,814 and 6,463,403. The basic idea of these methods of the prior art is to calibrate the two distinct models, one for the original process and the second for the new process, the output of which have to be matched to those of the original process. Once the two calibrations have been performed, it is necessary to alter the target of the original process into those of the new process using the two calibrated models. Several calculation procedures (two calibrations, two simulations and one correction) have to be run, which is still quite burdensome and computation heavy.

The assignee of the present application has already improved over this prior art by inventing a method to determine the parameters of an IC manufacturing process.

According to this invention which is disclosed in PCT/EP2015/062334, by a sizing correction table is applied to the geometry of target design, the parameters of the sizing correction table being determined as a function of the differences in the metrology results between the target process and a reference process.

This method alleviates the burden and the computing workload by implementing a single differential model, which allows a process to mimic the other (or vice-versa since the matching can work in both directions), therefore reducing the calibration and correction effort. Moreover, using the process matching method gives more flexibility to achieve a desired result by allowing to impose constraints to the matching process, for instance to retain a matching result, when the measurements points which are used are not well scattered across the whole design, or to perform one of an interpolation and an extrapolation between measurements, or to impose a linearity on a parameter.

But the sizing can only be applied within certain limits, i.e. it is not possible to apply a sizing beyond a limit because the process window decreases with the edge displacement.

To overcome these limitations, according to the invention, a dose correction is determined to be applied, at least partly, in lieu of the geometry correction to maintain an adequate level of process window.

SUMMARY OF THE INVENTION

To this effect, the invention discloses a method of determining, by a computer, an output vector comprising at least an output variable, said output vector defining corrections to be applied to at least a feature of a second process for manufacturing a semiconductor integrated circuit, said method comprising: obtaining a first series of values of an input vector for a first process for manufacturing the same semiconductor integrated circuit at a first plurality of points of a first layout, said input vector comprising at least an input variable; obtaining a second series of values of the at least a component of the input vector for the second process at one of the same first plurality of points on the first layout and a second plurality of points on a second layout; determining values of a state vector comprising at least a state variable, said state vector representative of a state of differences between the first and the second series of values of the input vector; obtaining by a direct calculation the output vector for the series of values of the state vector, the output vector comprising an edge displacement; the method further comprising determining from the edge displacement a second dose correction to be applied to the at least a feature of the first process, said at least a feature being a first dose correction.

Advantageously, the edge displacement is totally replaced by the second dose correction.

Advantageously, the edge displacement is only partly replaced by a fraction of the second dose correction.

Advantageously, determining from the edge displacement a second dose correction to be applied to the at least a feature of the first process is based on a reference physical model of said first process.

Advantageously, the invention further comprises, before determining from the edge displacement a second dose correction to be applied to the at least a feature of the first process, fracturing a contour of the target design.

Advantageously, fracturing a contour of the target design is performed only in a first dimension, if a second dimension is smaller than or equal to $2\alpha$, wherein $\alpha$ is a parameter of the reference physical model representing forward scattering effects.

Advantageously, the first process is a virtual process, the virtual process producing an output layout identical to an input layout.

Advantageously, the input vector comprises as input variables at least one of a CD and space of an input design of the integrated circuit.

Advantageously, the first layout is a calibration layout.

Advantageously, the first process is a reference process.

The method of one of claims 1 to 10, wherein the series of values of the state vector are calculated at the output of at least one of an interpolation and an extrapolation procedure using the first series and the second series of values of the input vector.

Advantageously, a first state variable is selected based on its discriminatory power for the at least a component of the parameters vector on a domain of values where the first and second processes are to be used.

Advantageously, at least a second state variable is added to the first state variable to increase the combined discriminatory power within a defined computing load budget.

Advantageously, the state vector comprises state variables which are representative of at least one of CD, space and density.

The invention also discloses a non-transitory storage media comprising thereon a computer program for determining a series of corrections to be applied to at least a second parameter of a second process for manufacturing a semiconductor integrated circuit, said computer program comprising computer code instructions configured for: obtaining a first series of values of an input vector for a first process for manufacturing the same semiconductor integrated circuit at a first plurality of points of a first layout, said input vector comprising at least an input variable; obtaining a second series of values of the at least a component of the input vector for the second process at one of the same first plurality of points on the first layout and a second plurality of points on a second layout; determining values of a state vector comprising at least a state variable, said state vector representative of a state of differences between the first and the second series of values of the input vector; obtaining by a direct calculation the output vector for the series of values of the state vector, the output vector comprising an edge displacement; the computer code instructions being further configured to determine from the edge displacement a second dose correction to be applied to the at least a feature of the first process, said at least a feature being a first dose correction.

The invention also discloses a semiconductor manufacturing equipment configured to use at least an output of a computer program according to the invention, said semiconductor manufacturing equipment configured for one of direct writing on semiconductor wafers, writing on a mask plate, etching, chemically or mechanically planarizing, or baking, annealing a semiconductor wafer, and inspecting a mask or semiconductor surface.

For a number of applications, the geometric layout should not be changed; then, thanks to the invention, a matching of a process with a reference process may be nevertheless performed using dose corrections only. For a number of other applications, it is also an advantage of the invention to allow a combination of dose and geometry corrections.

Also, it is possible to use an ideal reference process: the ideal process is the one which produces a target layout which is identical to the input layout. The method of the invention directly generates the corrections to be applied to the geometry of the input layout to produce the target layout.

BRIEF DESCRIPTION OF THE DRAWINGS

The invention will be better understood and its various features and advantages will become apparent from the description of various embodiments and of the following appended figures:

FIGS. 5*a* and 5*b* represent a fracturing step of the method of the invention in two embodiments of the invention;

DETAILED DESCRIPTION

Figure 1:
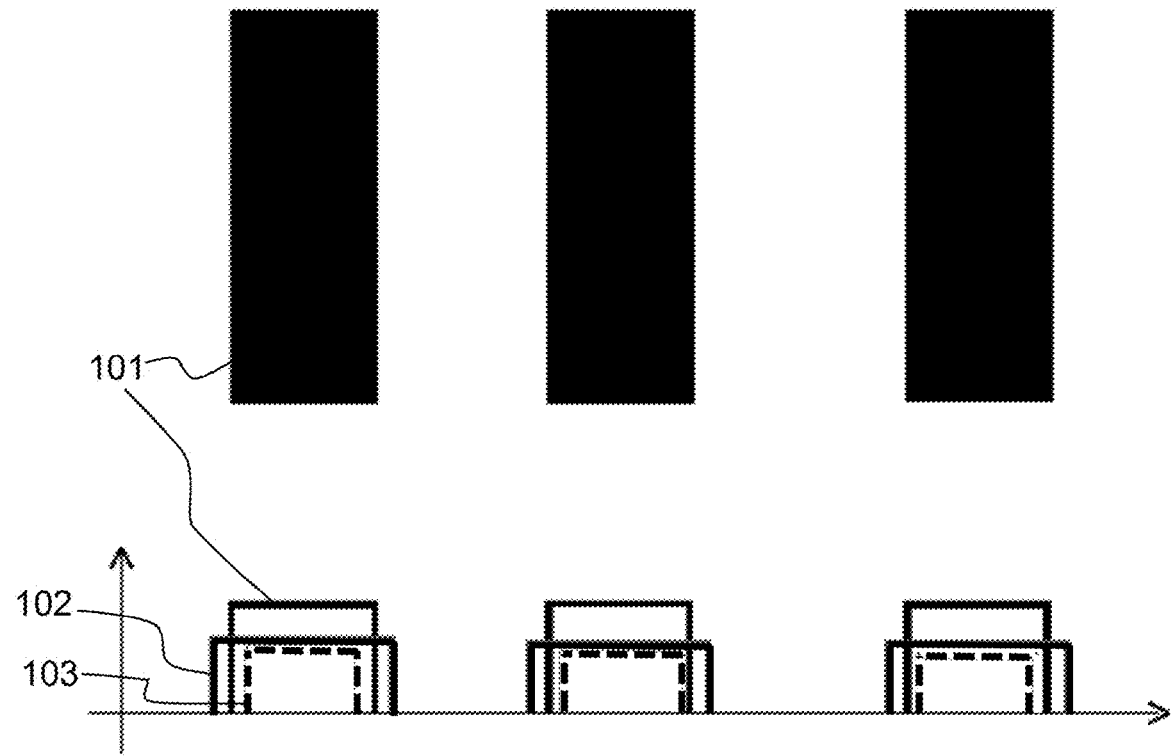
FIG. 1 illustrates a process matching method of the prior art using sizing correction tables.

FIG. 1 illustrates a process matching method of the prior art using sizing correction tables.

A target design 101 can be imprinted on a mask or a wafer using a first process, for which the geometry of the source design is 102, whereas, for a second process, the geometry of the source design will be 103. The problem to be solved to be able to replace the first process by the second process is to determine the geometry corrections to be applied to the source design 102 to obtain the target design 101, using the second process.

A differential method of the prior art to achieve this result is disclosed by PCT/EP2015/062334 assigned to the assignee of the instant application.

As will be explained further down in the description, in relation to FIG. 2, a sizing table is calibrated based on one or more reference designs, using metrics to establish a relationship in the table between input parameters (such as CD, Space or Density) and output parameters, such as an edge displacement.

Figure 2:
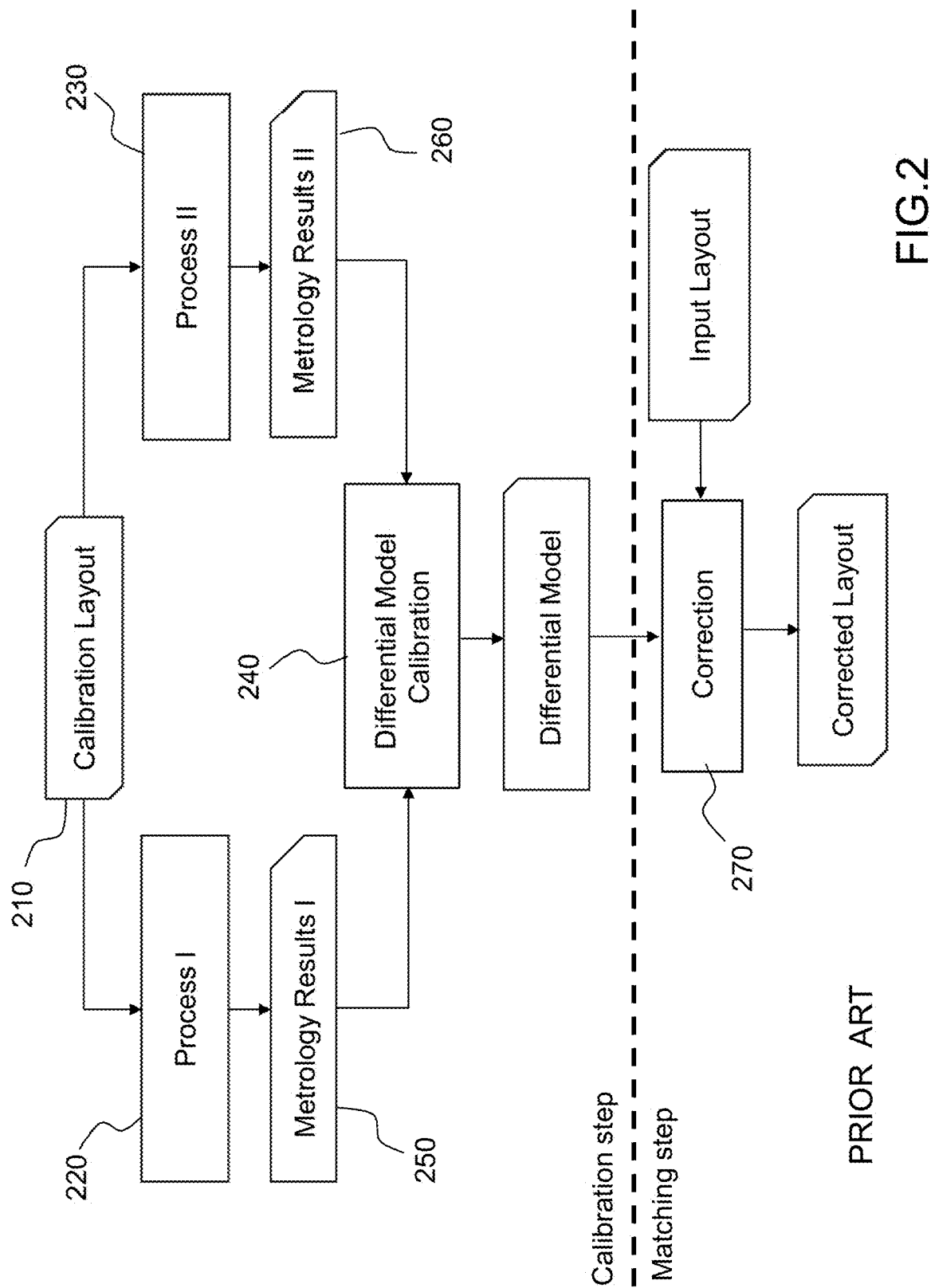
FIG. 2 represents a flow chart of a method of matching a second process to a first process in the prior art.

FIG. 2 represents a flow chart of a method of matching a second process to a first process in the prior art.

In this method of the prior art, the strategy consists in using measurements from both processes and then to calibrate a differential model that allows one process to mimic the other. In this approach, no other information is required from the processes being matched other than the metrology results. It is important to note that this approach also presents the advantage of allowing both processes to match each other using a single model, with no extra effort.

The first step 210 is to define a calibration layout, which may depend on the dominant features of the designs for which the processes to be matched 220, 230 are being used. For instance, if the process is mostly used for reproducing Manhattan designs with dense lines, preferably the calibration layout should include dense lines. Likewise, if the process is mostly used for dense or scattered free form designs. Optionally, it is not necessary to define a calibration layout. It is possible to use the metrology results or simulations of running the two processes to be matched on the target design.

At step 240, the method performs a calibration of a differential model on the results 250, 260 of the two processes 220, 230.

The resulting model can then be applied in a correction flow 270 using different types of process matching strategies.

A process for manufacturing semiconductor ICs is characterized by a number of variables which can be more or less important depending on the manufacturing steps and the type of target designs. When modeling the process effects, some variables will be chosen in the space domain, like Critical Dimension (CD), Space, Edge, Density. Some other will be chosen in the electron beam dose domain (for instance, resist threshold). Roughness of the contour can also be used, specifically when free-from designs are within the field of use of the process.

It can therefore be advantageous to represent the output variables to be a function of a vector. This vector will have as components the variables which have to be used, so that the differences between the processes throughout their field of use are well represented. Some of the variables will define the state of the model (CD, Space, Density, for instance). These variables can be named "state variables" or metrics, and will define a "state vector". Some other will define the differential output of the model (Edge displacement, Dose variation, combination of both, etc. . . . ). These variables will be named "output variables" and will define an "output vector".

The differential model can be advantageously calibrated from measurements on a calibration layout, which define "input variables" and can be grouped in an "input vector". Input variables can also be CD, Space or other parameters, such as contour roughness (i.e. Line Edge Roughness—LER—or Line Width Roughness—LWR), or Line End Shortening—LES, Corner Rounding, etc. . . . The measurements must be made at a number of points which is high enough to cover the field of use and the location of the points must also be representative of the diversity of the sub-layouts. But the invention can also be carried out without using a calibration layout step, which is tedious and costly;

When using a calibration layout, a first series of values of the input vector (250) is measured at a number of metrology points, applying Process I (220) and a second series of values of the parameters (260) is measured at the same metrology points, applying Process II (230). Typically, the number of metrology points is of the order of 1000.

According to this method, it is advantageous to define state variables, or "metrics", which are selected to be as representative as possible of the state of the differences of the input variables of the two processes throughout their field of use. Advantageously, the metrics will also be represented by a vector. The state vector can be constructed empirically by selecting a first component (for instance CD), testing the model, then adding a second one, a third one (for instance Space and Density), and so on, stopping the process when the increase in computing load reaches a predefined budget.

Various metrics can be used (Space, CD, Density, for instance). By way of examples defined in more details in PCT/EP2015/062334, in an arrangement of lines, a Space metric will measure an interstitial distance between the lines, a CD metric will measure a width of the lines (or vice-versa depending on the tone of the resist), and a Density metric will measure a ratio of the surface of the lines to the total surface of the design. Therefore, a combination of two or more metrics amongst these three will allow to better capture the specificities of different patterns in a design.

Indeed, CD, Space and Density are the input variables which are most often used to characterize a process to be able to calibrate a representative model.

Among a number of possible representations of the state variables of a target design viewed from a process, the ones which use the geometrical concept of "Kernel" bring some advantages since this concept can be used to define in relation to a set of patterns.

A particular Kernel function which is specifically advantageous was disclosed in PCT/EP2015/062301 co-assigned to the applicant of this application. There is disclosed in this application the use of a convolution on a visibility domain of the design by a compound of a kernel function and a deformation function, said deformation function depending on an angle of visibility and a shift angle. The use of a convolution function greatly alleviates the computation load.

At the output of this calculation of the metrics, a model of a relationship between the input variables and the output variables may be determined. This model can be converted into a table, which is more efficient, computer wise.

Then, a step 270 is applied whereby the output vector determined by the differential model of the invention is applied to the data preparation file of Process I to derive the data preparation file of Process II.

Different variants of this method can be advantageous to obtain the sizing table.

For instance, in a first variant, the use of a calibration layout can be cumbersome and costly. Instead, in a variant of this method, it can be advantageous to use existing metrology results which have been obtained from two different layouts.

Then, a calculation of the results of one of the metrology results of one of the layouts at a set of metrology points of the other layout is performed. Advantageously, this step is a combination of interpolations and extrapolations. This interpolation/extrapolation step can be linear or use a different function selected to take due account of the differences in the layouts. This step may introduce artefacts which will reduce the precision of the match and may have to be corrected. For instance, different sizing factors may be applied as correction, depending on the scale of the sub-parts of the design. Alternatively, the interpolation/extrapolation step can be applied to the state vector.

Then, a step of differential model calibration is applied, including use of a metrics vector, as explained above. Then, a step of correction of the data preparation file of Process I is applied to obtain the parameters of Process II, as explained above.

One of the advantages of this variant is that it allows calibration of a differential model without a need to have access to confidential data about the two processes which have to be matched.

In a second variant, one can use a process matching method using two reference input datasets and an interpolation/extrapolation method.

This is not very different from the previous variant, except that in lieu of layouts, the method uses as input data from the two processes to be matched that may not even be metrology results. As examples, input data can be a set of data simulated from an already existing model. It can also be a linearity requirement such as the bounds of a CD vs pitch curve.

The interpolation/extrapolation step is performed between the input data of Process I and Process II, instead of the metrology results of two different layouts. A correction step may also be applied.

The differential model calibration step and the design correction step of the previous embodiments are performed in the same manner as described above.

In a third variant, a calibration layout is used to obtain metrology results for Process I, and reference data of Process II are used.

The differential calibration step and the design correction step are applied in the same manner as described above.

In a fourth variant, a calibration layout is used to obtain metrology results for Process I and Process II.

Then, two different models are calibrated for Process I and Process II, or pre-existing calibration data may be re-used, and a differential model is then calibrated from the results of the calibration of the two models, using a metrics vector applied to the outputs of the calibration models of the two processes, instead of the metrology results.

In all the variants of this differential model calibration, Process I can be an ideal or perfect process, i.e. a process which always produces a target or output layout identical to the input layout.

In the embodiment of FIG. 2, Metrology Results I, 250, are defined as errors equal to zero nm at all points of the target layout. Therefore, the metrology data are virtual.

An advantage of using a differential model or sizing table to calculate the corrections to be applied to an actual process to match the results of a reference ideal process is that the geometry corrections to be applied to the input layout are determined directly at the output of the calculation. This is in contrast with the standard simulation approaches which are normally used to find an optimal solution within a defined tolerance. In these solutions it is necessary to invert the models used to determine the imprint in the resist of a defined input layout to find the geometry corrections to be applied to the latter to imprint the target layout in the resist. In practical terms, since these models are not generally invertible, it is necessary to apply a bootstrap method by calculating all solutions until one is found in the tolerance margin. This is a computer intensive, long and tedious process that is no longer needed when applying this method with an ideal reference process.

It is also to be noted that this method gives the displacements to be applied at defined points of the target contour, where the CD, Space and Density metrics may be defined. This is in contrast with a classic calculation by a simulation approach where the model calculates the dose to be applied at all points of the target contour, even at points where the above metrics are not defined.

Figure 3A:
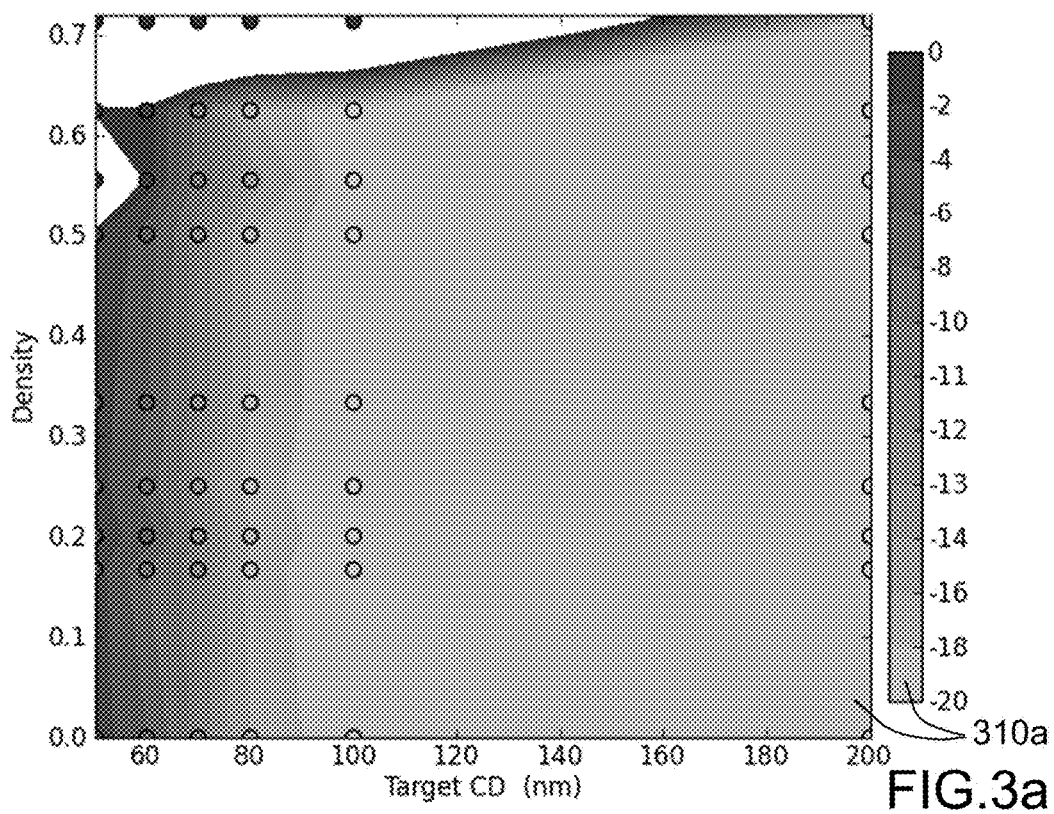
FIGS. 3*a* and 3*b* illustrate some limitations of the matching methods of the prior art.
Figure 3B:
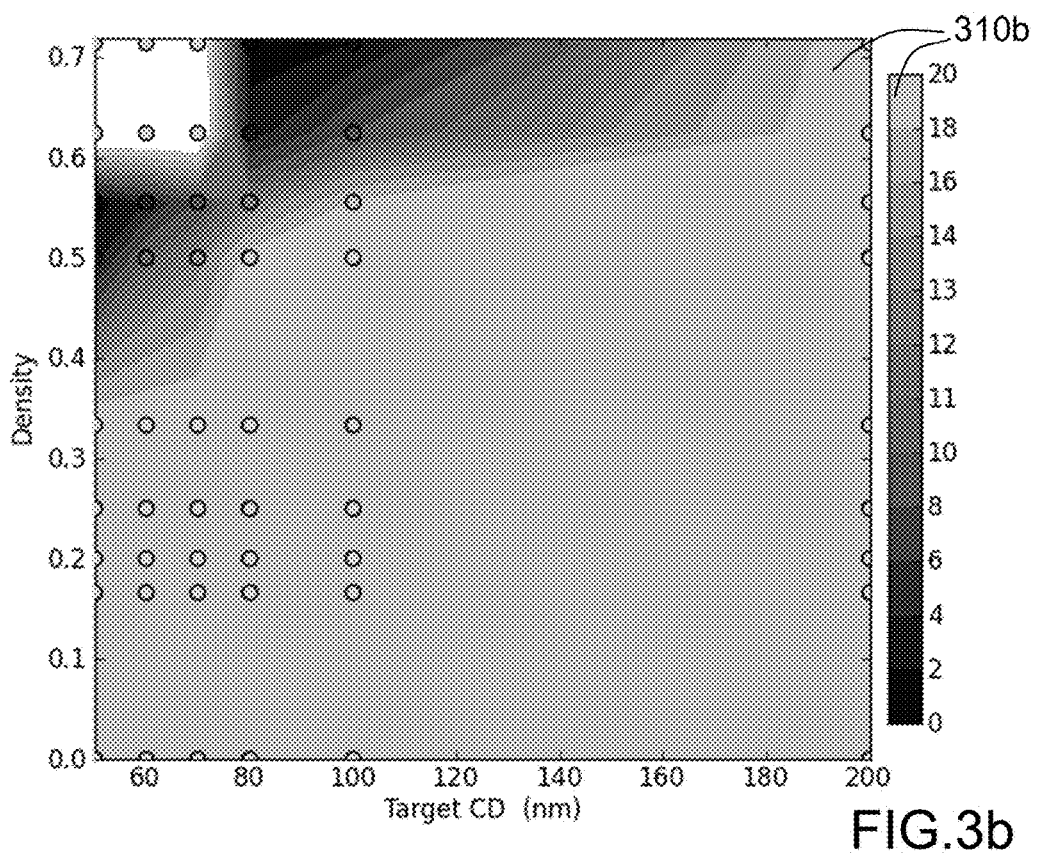

FIGS. 3a and 3b illustrate some limitations of the matching methods of the prior art.

The sizing corrections determined at the output of the method described above are only valid so long as the corrections are in the short range domain and the variations of the back-scattering (or long range) effect can be neglected (i.e. by way of example a long range density lower than 1). Also, preferably, the sizing corrections will be more robust if the patterns to be resized have a CD higher than $3\alpha$, where $\alpha$ is the short range parameter of the point spread function (PSF) which represents the physical model of the insulation process.

In FIG. 3a, a negative sizing procedure is illustrated, i.e. a sizing procedure whereby the size of the pattern imprinted by the target process will be smaller than the one of the reference process.

In FIG. 3b, a positive sizing procedure is illustrated, i.e. a sizing procedure whereby the size of the pattern imprinted by the target process will be larger than the one of the reference process.

By way of example only, sizing corrections between −20 nm and zero and between 0 and +20 nm are illustrated respectively in these two figures. Target CD varies between 50 and 1000 nm. Density varies between 0 and 0.83. Based on the validity limits explained above, the combinations of maximum density for a defined target CD which define the maximum sizing corrections are determined using a classical PSF with two Gaussians whose parameters are set at $\alpha=30$ (width of the forward scattered beam, FW), $\beta=9000$ (width of the backward scattered beam, BW), $\eta=0.83$ (ratio of the intensities of the FW and BW beams) and a tolerance of the correction process of 0.8 nm per edge (1.6 nm per CD).

Surfaces with the same shade 310a and 310b define the combinations of target CD and density for which the maximum amplitude of the sizing correction is possible (20 nm in this case). The value of the maximum amplitude of the sizing correction decreases from 20 nm to 0 going from surface 310a, 310b to the white surface. Process matching is not possible in the white surface.

One can see in FIG. 3a, for negative sizing, that for target CDs lower than 100 nm, the value of the maximum sizing decreases rapidly, even more so for densities higher than 0.6.

One can see in FIG. 3b, for positive sizing, that there is also a same type of constraint.

A geometry sizing procedure has therefore a narrow scope of validity for fine geometries in dense patterns. The invention overcomes this limitation of the prior art.

FIGS. 4a, 4b, 4c and 4d represent flow charts of process matching methods using dose corrections in a number of embodiments of variants of the invention.

We first describe a generic flow chart of a dose matching process according to the invention.

At step 410a, the target design to be matched with dose correction from a reference process is input in the method of the invention.

At step 420a, the contour of the target design is fractured, as explained below in relation to FIG. 5. Optionally, the whole target design, and not only its contour, may also be fractured at the same time.

At step 430a, dose corrections $D_0$ to be applied in the target process (Process II) are input in the method of the invention.

At step 440a, a reference physical model of the target process is input in the method of the invention. The reference model can be any PSF. A standard PSF comprises two Gaussians, one to model the forward scattering effects (short range), the other to model the backward scattering effects (long range). A PSF can also be based on other functions, like Voigt functions, or approximations thereof, including combinations of Lorentz and Gauss functions, or other types of functions, a best fit of which is determined by a calibration procedure. The reference model of the reference process allows production of a table to convert dose corrections for Process II into edge displacements. An inversion of such a table allows conversion of edge displacements or biases into dose corrections to be applied to obtain said displacements or biases. The reference physical model can then be represented by a table of values of a factor K to be applied to a shot with coordinates X, Y, where the base dose correction to be applied for the target process is $D_0$, which was determined at the output of step 430a. Calculation of K is discussed further down in the description in relation to FIG. 4c.

At step 450*a*, a differential model (or a sizing correction table or a bias table) is calculated, using one of the variants of the method discussed in relation to FIG. 2 above.

At step 460*a*, based on a targeted maximum amount of geometry correction defined in view of the density of the target design (see above in relation to FIGS. 3*a* and 3*b*), a proportion R of dose/geometry correction to be applied is calculated. For instance, a sizing correction of 20 nm for a target CD at a defined density is used. Then the remaining sizing correction to be applied is calculated and proportion R is calculated as the ratio of the correction applied by dose to the total correction (i.e. total edge displacement). A calculation of R is discussed further down in the description in relation with FIG. 4*d*.

Then the dose and geometry corrections to be applied are calculated at step 470*a*.

Figure 4A:
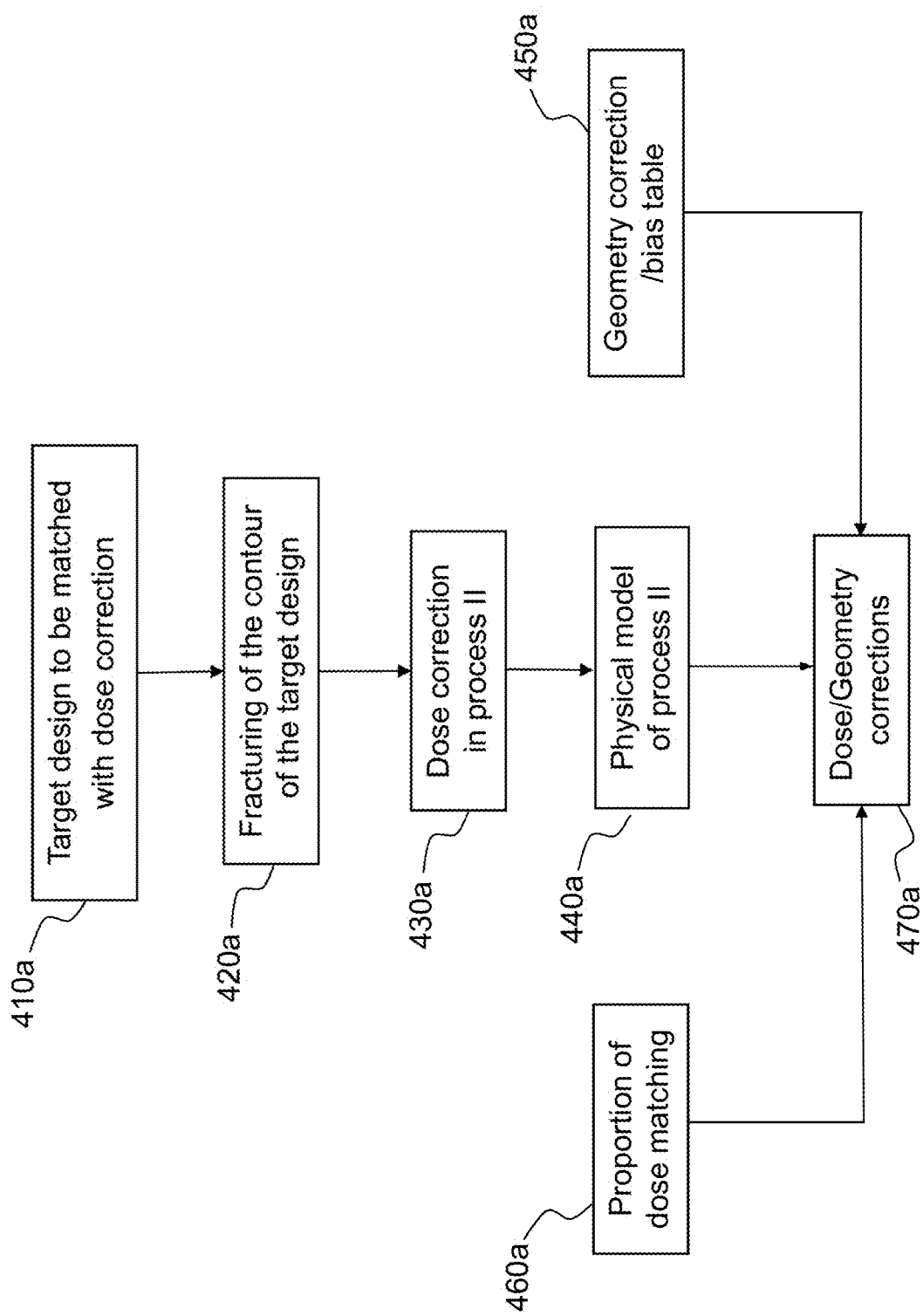
FIGS. 4*a*, 4*b*, 4*c* and 4*d* represent flow charts of process matching methods using dose corrections in a number of embodiments of variants of the invention.
Figure 4B:
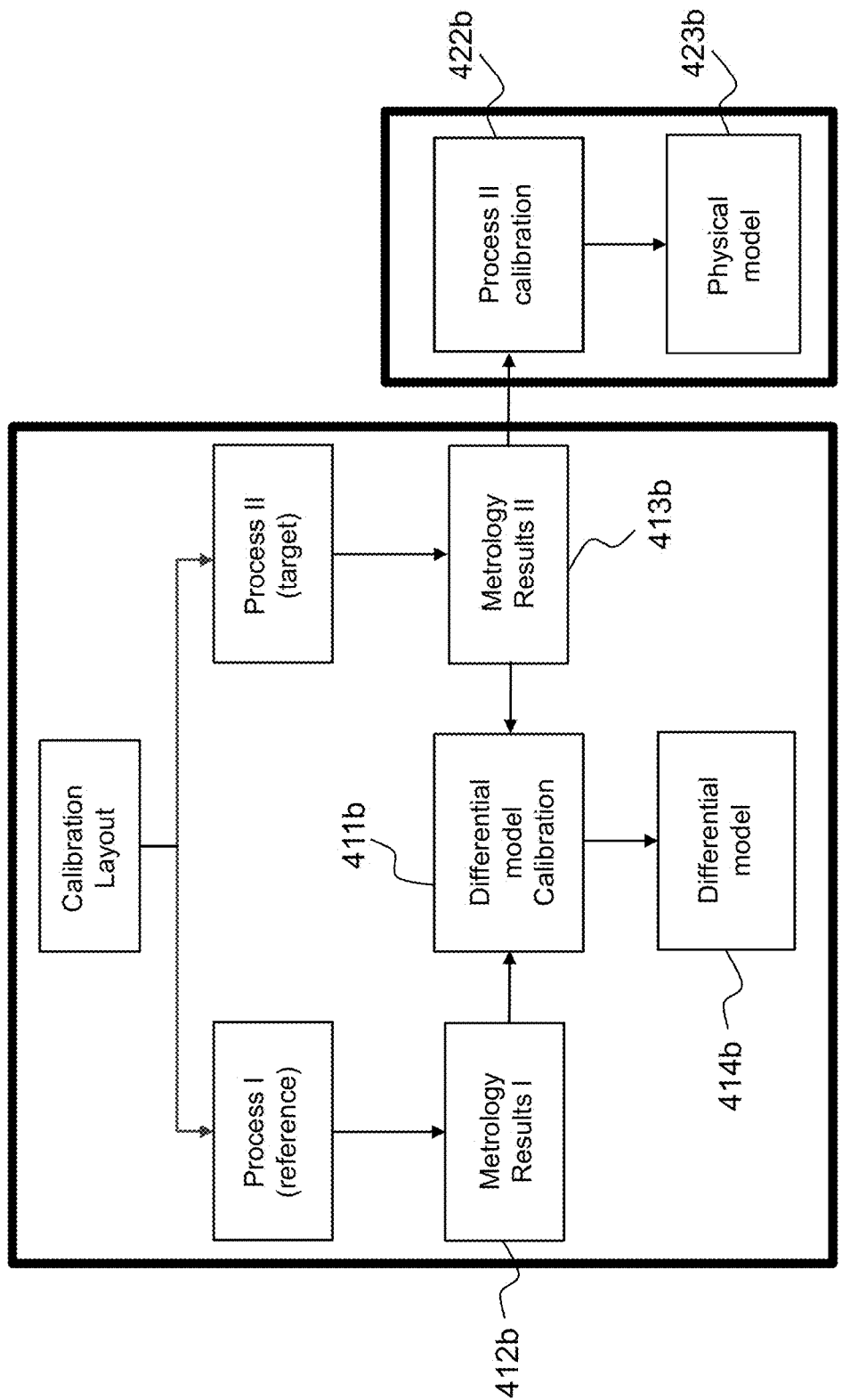

FIG. 4*b* represents an embodiment where the physical model of the target process (Process II) is calibrated, 422*b*, at the time of calibration 411*b* of the differential model for matching Process II to Process I using geometry corrections. The metrology results of Process II, 413*b*, are used for the two calibrations, whereas the metrology results of Process I, 412*b*, are only used to calibrate the differential geometry model. The resulting differential model 414*b* and physical model of the target process 423*b* which are obtained from the calibrations are then ready to be used in the dose/geometry correction step 470*a*. The models can be in the form of tables of bias and dose correction values. Instead of being calculated jointly, the models can be calculated separately from different metrology results. Or if the target process has a known physical model which has a good fit, this model may be used without prior calibration.

Figure 4C:
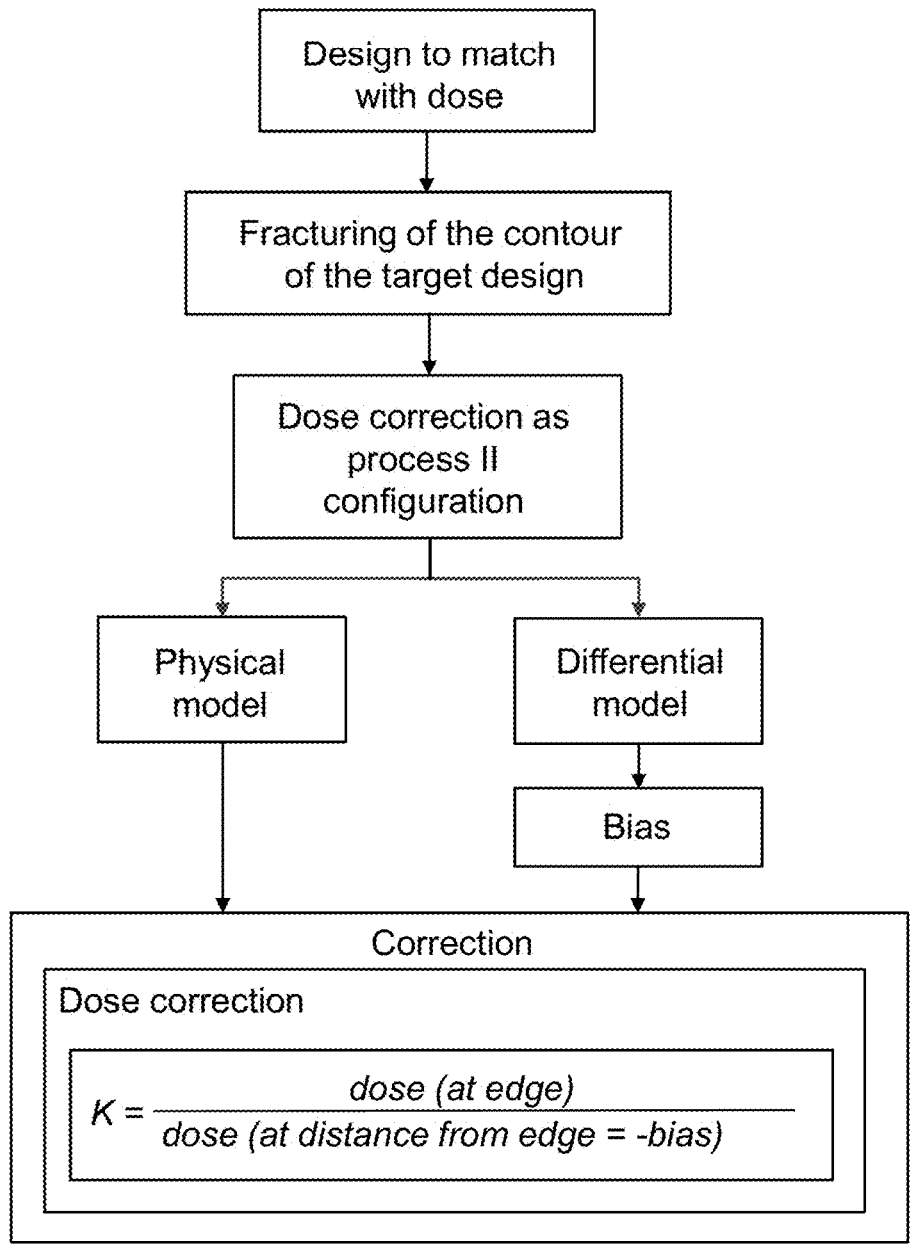

FIG. 4*c* illustrates a process matching method according to the invention using dose only.

The dose corrections are calculated using a factor K which is a ratio of the dose at the edge of the design after correction to the dose at the edge before correction. The total dose to be applied at the edge equals the value of the dose correction $D_0$ resulting from the physical model of the target process multiplied by (1+K)

Figure 4D:
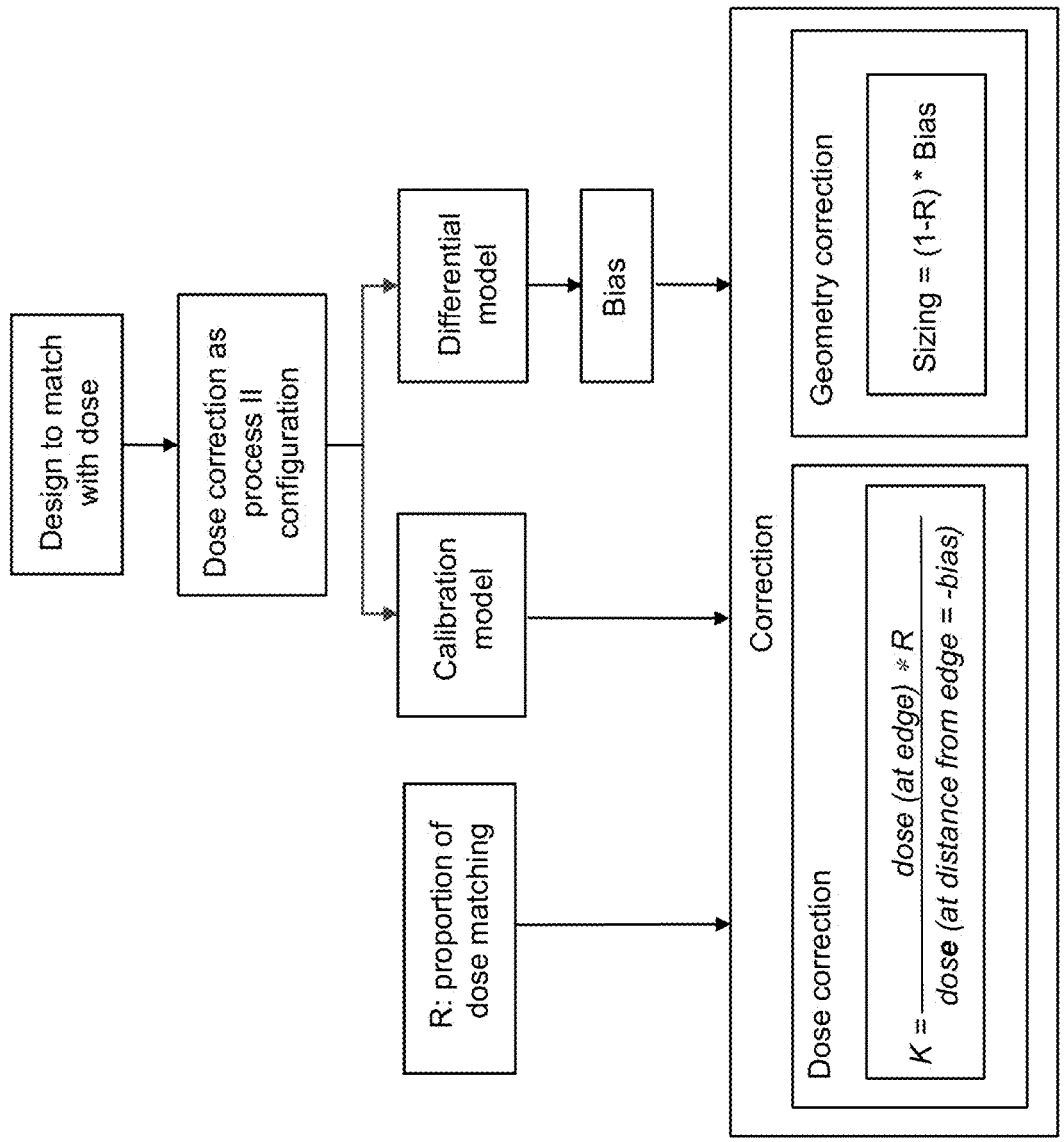

But a process matching method according to the invention may also combine geometry corrections and dose corrections. Such embodiments of the invention are illustrated in FIG. 4*d*. The proportion of the two corrections is defined by a parameter R.

When R=1, the matching is in dose only. When 0<R<1, a proportion R of the correction is first applied using the method of FIG. 4*c* and then a geometry correction is applied to obtain an additional sizing equal to the total bias to be obtained multiplied by (1−R).

R may be selected so as to keep the process window at a value superior to a threshold. A measurement of the process window is the Normalized Image Log Slope (NILS). See description of FIGS. 7*a* and 7*b* further down in the description. In some advantageous embodiments, R will be selected so as to keep the NILS index at a value higher than 2. Different values for R may be selected for different areas of the target design. For instance a higher proportion of matching in dose (i.e. a higher value for R) may be selected for denser areas in a target design than for less dense areas. This is because the degradation in process window or NILS index will be higher in these denser areas if process matching relies more on geometry matching. In some embodiments, R may be varied shot by shot, if this is required because of differences in densities.

FIGS. 5*a* and 5*b* represent a fracturing step of the method of the invention in two embodiments of the invention.

α being a parameter of the PSF which defines the range of the forward scattering effects, it is a rule of art that the width of a shot resulting from fracturing of a design should be larger than 2α. Therefore, if a pattern on a contour of the design is wider than 5α, as in FIG. 5*b*, it should be fractured in at least two shots of a width of 2α each. Conversely, if the width of the contour is smaller than 5α, as in FIG. 5*a*, it should only be fractured along its length, not its width.

Then the matching process can be applied to each shot.

Figure 6A:
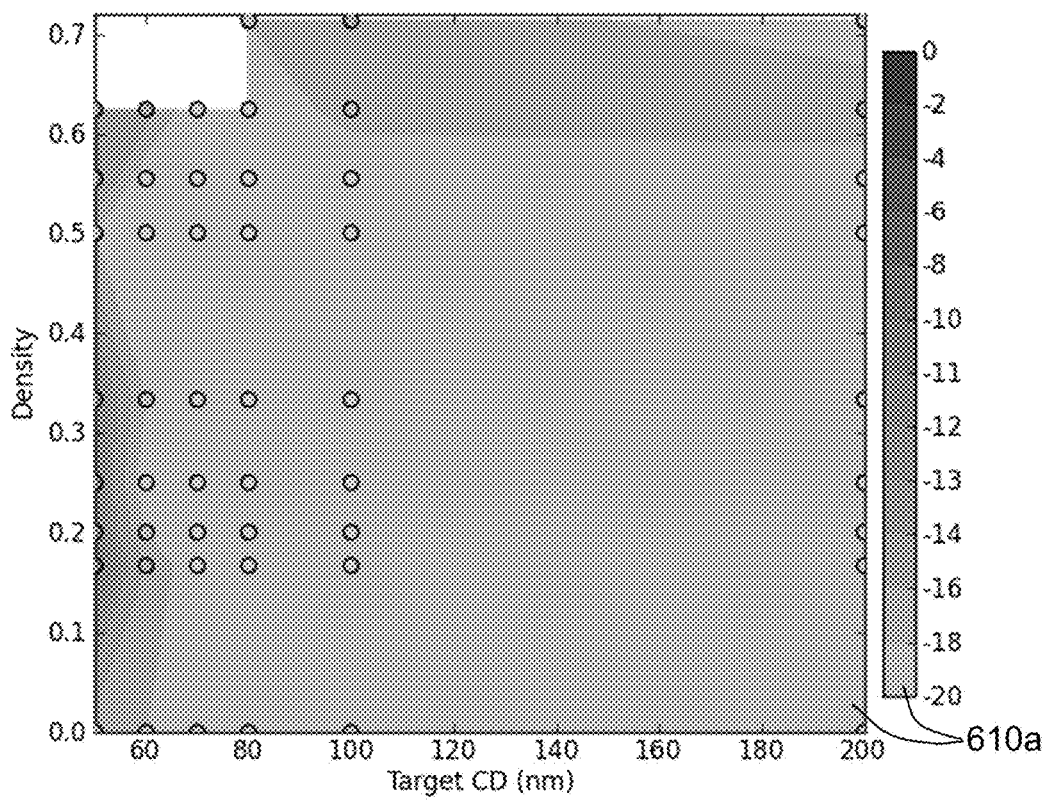
FIGS. 6*a* and 6*b* illustrate an impact of the dose correction method of the invention of the process resolution, respectively using a down-scaling factor and an up-scaling factor, in a number of embodiments of the invention.
Figure 6B:
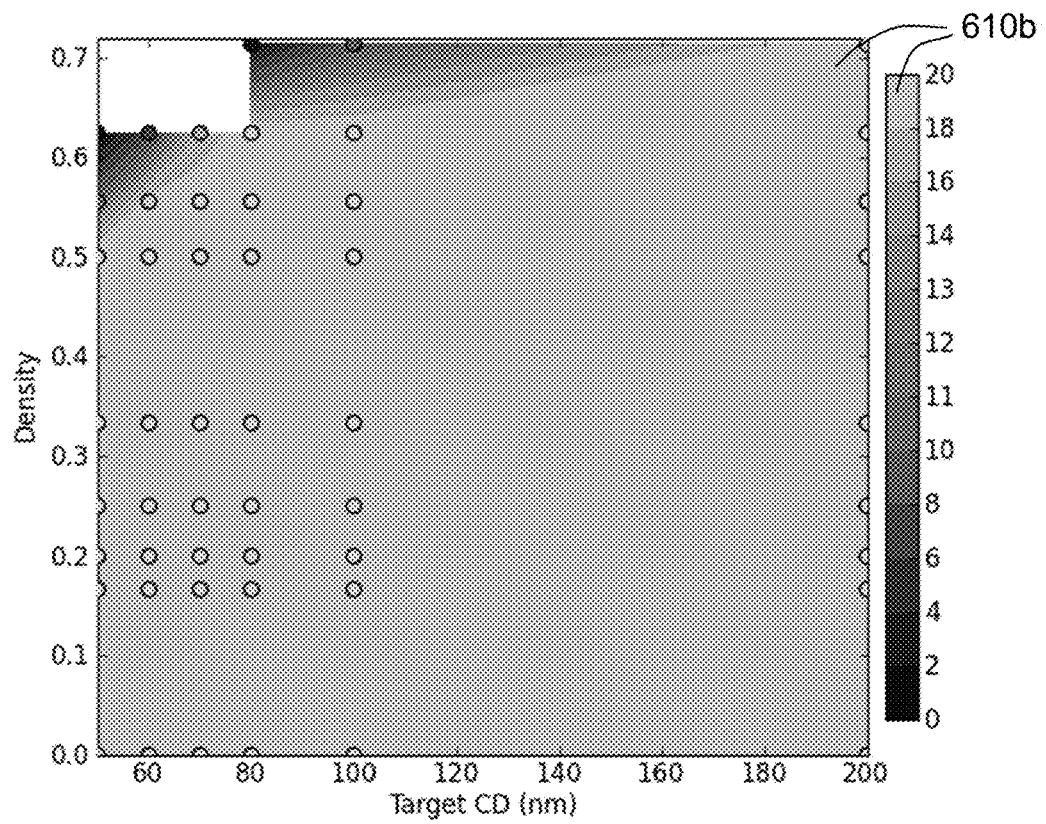

FIGS. 6*a* and 6*b* illustrate an impact of the dose correction method of the invention of the process resolution, respectively using a downscaling factor and an up-scaling factor, in a number of embodiments of the invention.

It can be seen in the figures, that both in the case of negative corrections (FIG. 6*a*) and of positive corrections (FIG. 6*b*) using pure dose corrections, the domain of validity of process matching is increased when comparing to FIGS. 3*a* and 3*b*, where geometry corrections only are applied. This difference is measured by the larger size of the areas 610*a* (respectively 610*b*) if FIG. 6*a* (respectively 6*b*), is compared to FIG. 3*a* (respectively 3*b*).

Figure 7A:
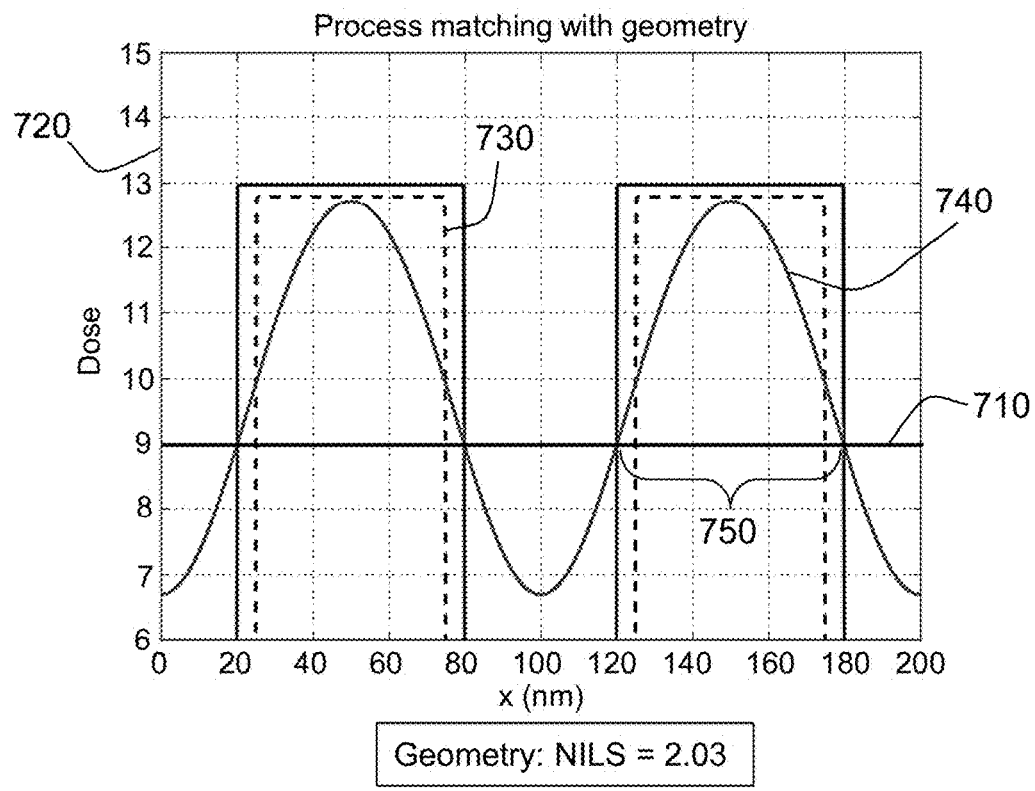
FIGS. 7*a* and 7*b* outline a comparison between a geometry matching process of the prior art and a dose matching process according to the invention.
Figure 7B:
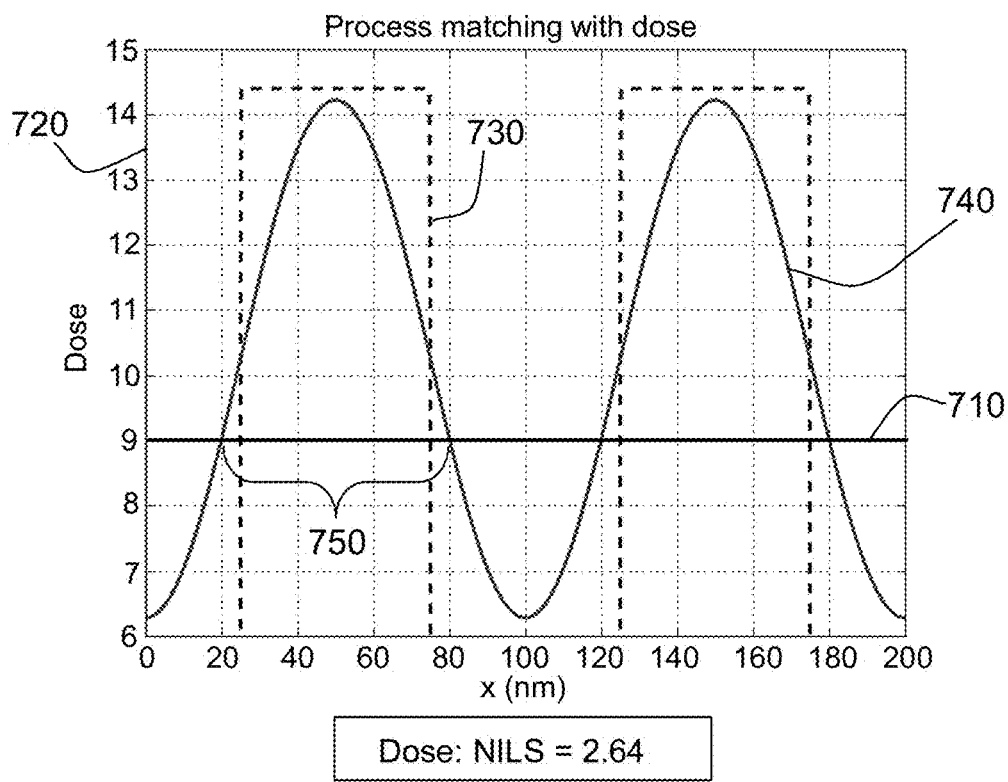

FIGS. 7*a* and 7*b* outline a comparison between a geometry matching process of the prior art and a dose matching process according to the invention.

The two figures represent graphs with a dimension of the design to be imprinted in abscissa (in nm), the resist threshold 710, and the exposure dose 720 in ordinate. The original width 730 of the pattern is transformed into a width 750 of the printed pattern by the received dose at the resist level 740.

The NILS index is defined by the following formula:

$$NILS = w \cdot \frac{1}{Threshold} \cdot \frac{d(Dose)}{dx}$$

Where:
"w" is width 730 of the nominal pattern;
"Dose" is the dose 740 received at the resist level;
"Threshold" is the resist threshold 710.

FIG. 7*a* represents a case where a process matching with geometry only is applied. FIG. 7*b* represents a case where a process matching with dose only is applied. By way of example only, it can be seen in the figures that the process window (the slope of the received dose at the threshold level) is higher in the second case than in the first case: the NILS index of the process with matching in dose (FIG. 7*b*) is 2.64, whereas the NILS index of the process with matching in geometry (FIG. 7*a*) is 2.03.

The method of the invention may be used in many use cases where process matching using a differential model may be interesting, such as:

E-beam Direct Write or optical projection lithography on semiconductor wafer: the method of the invention may be used to absorb the changes in the fabrication, like a different resist or a new machine and provide the same results on wafer than with the original process;

Mask Write: the method of the invention may be used to absorb the changes in the mask writing flow, being able to provide identical printing masks from different flows; it is possible to take due account of wafer effects in the mask writing step.

Inspection: sometimes it is more important to be consistent than accurate when it comes to metrology standard;

using the process matching of the invention may allow different metrology systems to be calibrated to provide equivalent results;

Other steps of a semiconductor manufacturing process, such as etching, CMP annealing, for example.

The examples disclosed in this specification are only illustrative of some embodiments of the invention. They do not in any manner limit the scope of said invention which is defined by the appended claims.

The invention claimed is:

1. A method of determining, by a computer, an output vector comprising at least an output variable, said output vector defining corrections to be applied to at least a feature of a second process for manufacturing a semiconductor integrated circuit, said method comprising:

obtaining a first series of values of an input vector for a first process for manufacturing the same semiconductor integrated circuit at a first plurality of points of a first layout, said input vector comprising at least an input variable;

obtaining a second series of values of the at least a component of the input vector for the second process at one of the same first plurality of points on the first layout and a second plurality of points on a second layout;

determining values of a state vector comprising at least a state variable, said state vector representative of a state of differences between the first and the second series of values of the input vector;

obtaining by a direct calculation the output vector for the series of values of the state vector, the output vector comprising an edge displacement;

the method further comprising determining from the edge displacement a second dose correction to be applied to the at least a feature of the first process, said at least a feature being a first dose correction.

2. The method of claim 1, wherein the edge displacement is totally replaced by the second dose correction.

3. The method of claim 1, wherein the edge displacement is only partly replaced by a fraction of the second dose correction.

4. The method of claim 1, wherein determining from the edge displacement a second dose correction to be applied to the at least a feature of the first process is based on a reference physical model of said first process.

5. The method of claim 4, further comprising, before determining from the edge displacement a second dose correction to be applied to the at least a feature of the first process, fracturing a contour of the target design.

6. The method of claim 5, wherein fracturing a contour of the target design is performed only in a first dimension, if a second dimension is smaller than or equal to 2a, wherein a is a parameter of the reference physical model representing forward scattering effects.

7. The method of claim 1, wherein the first process is a virtual process, the virtual process producing an output layout identical to an input layout.

8. The method of claim 1, wherein the input vector comprises as input variables at least one of a CD and space of an input design of the integrated circuit.

9. The method of claim 1, wherein the first layout is a calibration layout.

10. The method of claim 1, wherein the first process is a reference process.

11. The method of claim 1, wherein the series of values of the state vector are calculated at the output of at least one of an interpolation and an extrapolation procedure using the first series and the second series of values of the input vector.

12. The method of claim 1, wherein a first state variable is selected based on its discriminatory power for the at least a component of the parameters vector on a domain of values where the first and second processes are to be used.

13. The method of claim 12, wherein at least a second state variable is added to the first state variable to increase the combined discriminatory power within a defined computing load budget.

14. The method of claim 13, wherein the state vectors comprises state variables which are representative of at least one of CD, space and density.

15. A non-transitory storage media comprising thereon a computer program for determining a series of corrections to be applied to at least a second parameter of a second process for manufacturing a semiconductor integrated circuit, said computer program comprising computer code instructions configured for:

obtaining a first series of values of an input vector for a first process for manufacturing the same semiconductor integrated circuit at a first plurality of points of a first layout, said input vector comprising at least an input variable;

obtaining a second series of values of the at least a component of the input vector for the second process at one of the same first plurality of points on the first layout and a second plurality of points on a second layout;

determining values of a state vector comprising at least a state variable, said state vector representative of a state of differences between the first and the second series of values of the input vector;

obtaining by a direct calculation the output vector for the series of values of the state vector, the output vector comprising an edge displacement;

the computer code instructions being further configured to determine from the edge displacement a second dose correction to be applied to the at least a feature of the first process, said at least a feature being a first dose correction.

16. A semiconductor manufacturing equipment configured to use at least an output of a computer program according to claim 15, said semiconductor manufacturing equipment configured for one of direct writing on semiconductor wafers, writing on a mask plate, etching, chemically or mechanically planarizing, or baking, annealing a semiconductor wafer, and inspecting a mask or semiconductor surface.

* * * * *

UNITED STATES PATENT AND TRADEMARK OFFICE
CERTIFICATE OF CORRECTION

PATENT NO. : 10,578,978 B2
APPLICATION NO. : 15/763829
DATED : March 3, 2020
INVENTOR(S) : Mohamed Saib et al.

It is certified that error appears in the above-identified patent and that said Letters Patent is hereby corrected as shown below:

In the Claims

In Claim 6, Column 11, Line 53, "equal to 2a, wherein a is a parameter" should be -- equal to $2\alpha$, wherein $\alpha$ is a parameter --.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*